(12) United States Patent
Kobayashi

(10) Patent No.: US 11,084,505 B2
(45) Date of Patent: Aug. 10, 2021

(54) OVERHEAD CONVEYANCE VEHICLE

(71) Applicant: MURATA MACHINERY, LTD., Kyoto (JP)

(72) Inventor: Makoto Kobayashi, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 113 days.

(21) Appl. No.: 16/482,723

(22) PCT Filed: Dec. 25, 2017

(86) PCT No.: PCT/JP2017/046386
§ 371 (c)(1),
(2) Date: Aug. 1, 2019

(87) PCT Pub. No.: WO2018/142811
PCT Pub. Date: Aug. 9, 2018

(65) Prior Publication Data
US 2020/0223455 A1 Jul. 16, 2020

(30) Foreign Application Priority Data

Feb. 6, 2017 (JP) .............................. JP2017-019686

(51) Int. Cl.
*B61B 3/02* (2006.01)
*B65G 1/04* (2006.01)
*B65G 1/06* (2006.01)
*H01L 21/677* (2006.01)

(52) U.S. Cl.
CPC .............. *B61B 3/02* (2013.01); *B65G 1/0457* (2013.01); *B65G 1/0464* (2013.01); *B65G 1/065* (2013.01); *H01L 21/67724* (2013.01); *H01L 21/67733* (2013.01)

(58) Field of Classification Search
CPC ......... H01L 21/67265; H01L 21/67712; H01L 21/67386; H01L 21/67706; H01L 21/67733; B66C 19/00; B65G 1/0457
See application file for complete search history.

(56) References Cited

U.S. PATENT DOCUMENTS

| 6,267,259 | B1 | 7/2001 | Shiwaku | |
| 9,312,158 | B2 * | 4/2016 | Wada | H01L 21/67733 |
| 10,497,595 | B2 * | 12/2019 | Kobayashi | H01L 21/67265 |

(Continued)

FOREIGN PATENT DOCUMENTS

| JP | 2000-191272 A | 7/2000 | |
| JP | 6064940 B2 * | 1/2017 | H01L 21/67733 |

(Continued)

*Primary Examiner* — Kaitlin S Joerger
(74) *Attorney, Agent, or Firm* — Keating & Bennett, LLP

(57) ABSTRACT

An overhead transport vehicle travels along a travel rail and conveys a FOUP including a removable lid in a suspended state. The overhead transport vehicle includes a holder to grip the FOUP with the lid oriented in a width direction crossing the traveling direction, a pair of frames provided at the front and the back in the traveling direction relative to the holder, and a first lid drop-preventing member pivotable along a horizontal plane about a pivot shaft in the vertical direction, between an advanced position in front of the lid and a retracted position at a position retracted from the front of the lid.

14 Claims, 11 Drawing Sheets

(56) References Cited

U.S. PATENT DOCUMENTS

| | | | |
|---|---|---|---|
| 10,643,877 B2 * | 5/2020 | Ogo | .......... H01L 21/67736 |
| 2011/0062103 A1 * | 3/2011 | Honda | .......... H01L 21/67736 |
| | | | 212/71 |
| 2014/0047995 A1 | 2/2014 | Kobayashi | |
| 2020/0223455 A1 * | 7/2020 | Kobayashi | .......... B65G 1/0457 |
| 2020/0331503 A1 * | 10/2020 | Kobayashi | .......... H01L 21/68707 |

FOREIGN PATENT DOCUMENTS

| | | | | |
|---|---|---|---|---|
| JP | 2017202885 A * | 11/2017 | ....... | H01L 21/67386 |
| WO | WO-2009141976 A1 * | 11/2009 | ....... | H01L 21/67733 |
| WO | WO-2012157319 A1 * | 11/2012 | ....... | H01L 21/67736 |
| WO | WO-2018142811 A1 * | 8/2018 | ....... | H01L 21/67733 |
| WO | WO-2019146278 A1 * | 8/2019 | ............. | B66C 11/06 |

\* cited by examiner

OVERHEAD CONVEYANCE VEHICLE

BACKGROUND OF THE INVENTION

1. Field of the Invention

An aspect of the present invention relates to an overhead transport vehicle.

2. Description of the Related Art

Overhead transport vehicles are known to travel through a location near the ceiling or higher than the floor, for example, in a clean room to convey articles such as semiconductor wafers or liquid crystal substrates (for example, see Japanese Unexamined Patent Publication No. 2000-191272). Such an overhead transport vehicle conveys an article stored in a container with a lid.

SUMMARY OF THE INVENTION

Since such overhead transport vehicles travel through a higher position, work vehicles or unmanned transport vehicles pass through or work vehicles perform operation below a travel rail of the overhead transport vehicles. In order to ensure safety in case of dropping of the lid from an overhead transport vehicle, access of work vehicles below the travel rail is sometimes restricted during traveling of overhead transport vehicles. However, such operation is inconvenient because access of work vehicles is restricted every time the overhead transport vehicle passes.

Preferred embodiments of the present invention provide overhead transport vehicles that each prevent dropping of a lid from a container.

An overhead transport vehicle according to an aspect of a preferred embodiment of the present invention is able to travel along a track and convey a container in a suspended state, the container including a removable lid. The overhead transport vehicle includes a gripper to grip the container with the lid oriented in a width direction crossing a traveling direction, a pair of frames disposed at front and back in the traveling direction relative to the gripper, and a first lid drop-preventing member pivotable along a horizontal plane about a pivot shaft in a vertical direction, between an advanced position disposed in front of the lid and a retracted position disposed at a position retracted from the front of the lid.

In the overhead transport vehicle with this configuration, since the first lid drop-preventing member is provided and has a pivot shaft in the vertical direction and is able to advance to the advanced position disposed in front of the lid, the lid is able to be held in position even if the lid is detached from the container. This configuration prevents dropping of the lid from the container.

In an overhead transport vehicle according to an aspect of a preferred embodiment of the present invention, each of the pair of frames may store therein a pivot mechanism for the first lid drop-preventing member. When a position of the lid in the width direction is a reference position, a position of the pivot shaft may be offset behind the reference position with the lid viewed from the front.

In such an overhead transport vehicle, it is desired that the front-side frame and the back-side frame disposed at the front and the back of the body frame have a reduced or minimum size in the width direction perpendicular or substantially perpendicular to the traveling direction in order to reduce the limit of movement in the traveling direction. In the overhead transport vehicle with this configuration, since the position of the pivot shaft is offset behind the reference position with the lid viewed from the front, the pivot mechanism for the first lid drop-preventing member is able to be brought closer to the center in the width direction of the frame. This configuration reduces or prevents an increase in size in the frame width direction even when the pivot mechanism for the lid drop-preventing member is provided in each of the frames at the front and the back in the traveling direction.

In an overhead transport vehicle according to an aspect of a preferred embodiment of the present invention, the first lid drop-preventing member may be a plate-shaped member extending from the pivot shaft to a front end and including a bending portion and a linear portion between the bending portion and the front end. In the overhead transport vehicle with this configuration, for example, when the first lid drop-preventing member is positioned at the advanced position, the first lid drop-preventing member is able to be set in parallel or substantially in parallel with the lid. The distance between the first lid drop-preventing member and the container therefore is able to be easily adjusted.

In an overhead transport vehicle according to an aspect of a preferred embodiment of the present invention, the linear portion may be disposed in parallel or substantially in parallel with the lid when the first lid drop-preventing member is positioned at the advanced position. In the overhead transport vehicle with this configuration, the distance between the first lid drop-preventing member and the container is able to be easily adjusted.

In an overhead transport vehicle according to an aspect of a preferred embodiment of the present invention, when the first lid drop-preventing member is positioned at the advanced position, letting a distance between an end portion of the container in the traveling direction and the first lid drop-preventing member be a first distance and the distance between a center portion closer to a center than the end portion of the container and the first lid drop-preventing member be a second distance, the first distance may be equal to the second distance or longer than the second distance. In the overhead transport vehicle with this configuration, the distance from the end portion of the container with which the first lid drop-preventing member tends to come into contact is able to be easily adjusted.

An overhead transport vehicle according to an aspect of a preferred embodiment of the present invention may further include a guide disposed at each of the pair of frames. The guide includes a first support portion with a cylindrical shape extending in the vertical direction and a second support portion disposed so as to be pivotable along an outer circumferential surface of the first support portion to maintain a certain gap from the outer circumferential surface of the first support portion. The first lid drop-preventing member may be movable in the gap. In the overhead transport vehicle with this configuration, the first lid drop-preventing member is able to be smoothly moved to the advanced position and the retracted position. In addition, the first lid drop-preventing member is able to be stored in the frame stably against vibration during traveling.

An overhead transport vehicle according to an aspect of a preferred embodiment of the present invention may further include a second lid drop-preventing member movable between an advanced position disposed below the lid and a retracted position disposed at a position retracted from below the lid. Movement of the second lid drop-preventing member to the advanced position and the retracted position may be interlocked with movement of the first lid drop-preventing member to the advanced position and the retracted position. In the overhead transport vehicle with this configuration, since the members having different functions are able to be moved simultaneously, dropping of the lid is able to be effectively prevented. The different members are able to be moved, for example, using a common drive source.

An overhead transport vehicle according to an aspect of a preferred embodiment of the present invention may further include a swing-preventing member movable between an advanced position disposed in contact with a side surface of the container and a retracted position disposed at a position away from the side surface of the container. Movement of the swing-preventing member to the advanced position and the retracted position may be interlocked with movement of the first lid drop-preventing member to the advanced position and the retracted position. In the overhead transport vehicle with this configuration, since the members having different functions are able to be moved simultaneously, dropping of the lid and swinging of the container is able to be effectively prevented. The different members are able to be moved, for example, using a common drive source.

According to preferred embodiments of the present invention, dropping of the lid from the container is able to be prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the drawings. It is noted that in a description of the drawings the same elements are denoted by the same reference signs and an overlapping description will be omitted.

Figure 1:
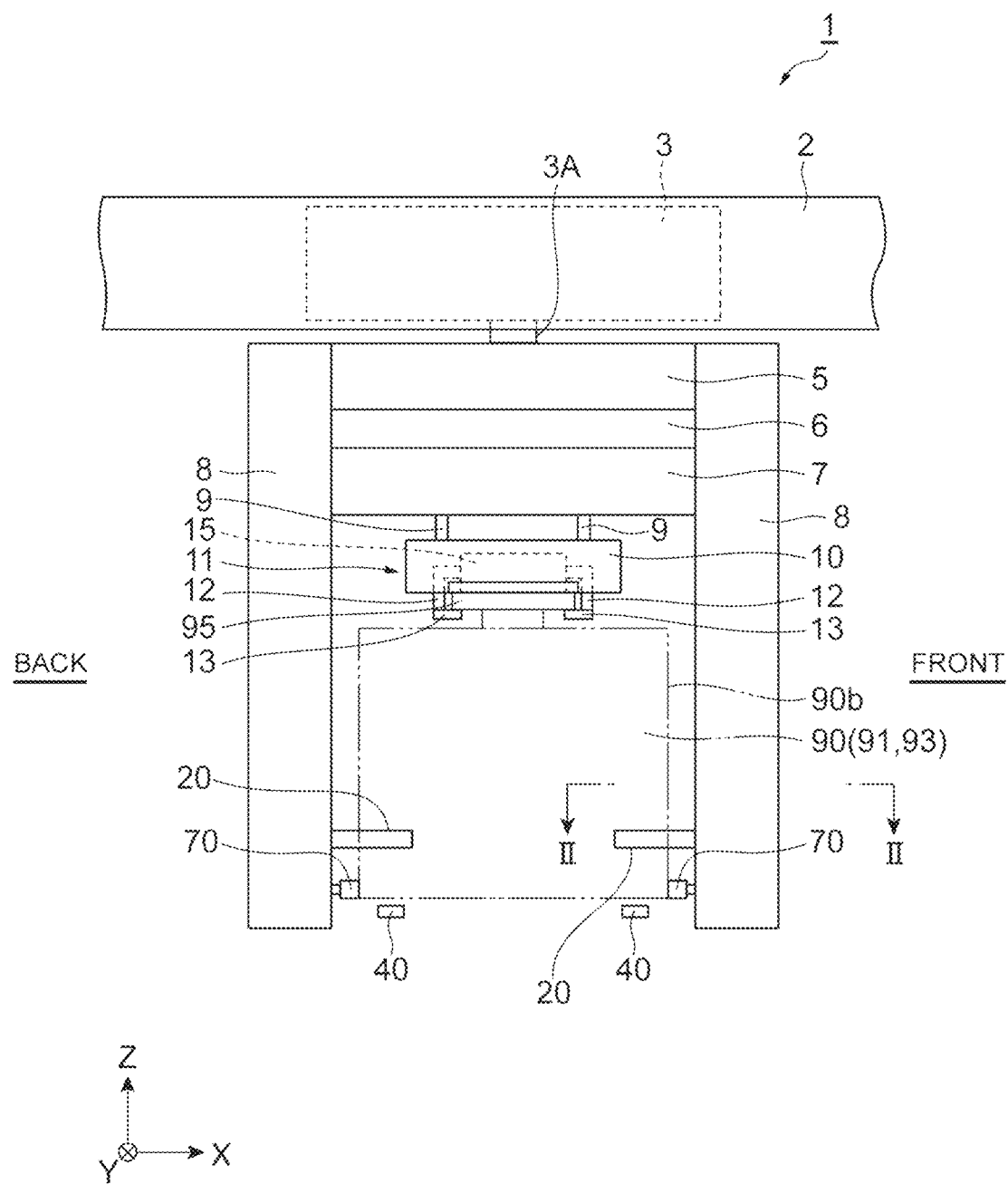
FIG. 1 is a front view illustrating an overhead transport vehicle according to a preferred embodiment of the present invention.

An overhead transport vehicle 1 illustrated in FIG. 1 travels along a travel rail (track) 2 provided at a position higher than the floor, such as the ceiling of a clean room. The overhead transport vehicle 1 conveys a front-opening unified pod (FOUP) (container) 90, for example, between a storage facility and a predetermined load port. The FOUP 90 has a box-shaped casing 91 having an opening and a lid 93 covering the opening. The lid 93 is removable from the casing 91. For example, a plurality of semiconductor wafers or reticles are stored in the FOUP 90. The FOUP 90 includes a flange 95 to be held by the overhead transport vehicle 1.

In the following description, the left-right direction (the X-axis direction) in FIG. 1 is the front-back direction (traveling direction) of the overhead transport vehicle 1, for convenience of explanation. The up-down direction in FIG. 1 is the vertical direction (the Z-axis direction) of the overhead transport vehicle 1. The depth direction in FIG. 1 is the width direction (the Y-axis direction) of the overhead transport vehicle 1. The X axis, the Y axis, and the Z axis are orthogonal to each other.

As illustrated in FIG. 1, the overhead transport vehicle 1 includes a travel driver 3, a horizontal driver 5, a rotation driver 6, an elevation driver 7, an elevation device 10, a holder (gripper) 11, a first lid drop-preventing member 20, a second lid drop-preventing member 40, a swing-preventing member 70, a pivot mechanism 50 (see FIG. 3) for the first lid drop-preventing member 20, and a movement mechanism 60 (see FIG. 8) for the second lid drop-preventing member 40 and the swing-preventing member 70. The overhead transport vehicle 1 is provided with a pair of frames 8 and 8 in the front-back direction so as to cover the horizontal driver 5, the rotation driver 6, the elevation driver 7, the elevation device 10, and the holder 11. A pair of frames 8 and 8 defines a space in which a FOUP 90 is stored below the holder 11 in a state in which the elevation device 10 is elevated to the elevation end.

The travel driver 3 moves the overhead transport vehicle 1 along the travel rail 2. The travel driver 3 is disposed in the travel rail 2. The travel driver 3 drives a roller (not shown) traveling on the travel rail 2. The horizontal driver 5 is connected below the travel driver 3 with a shaft 3A interposed. The horizontal driver 5 moves the rotation driver 6, the elevation driver 7, and the elevation device 10 in a direction (width direction) orthogonal to the extending direction of the travel rail in a horizontal plane. The rotation driver 6 rotates the elevation driver 7 and the elevation device 10 in a horizontal plane. The elevation driver 7 elevates and lowers the elevation device 10 by winding and unwinding a plurality of belts 9, for example. An appropriate suspension including, for example, wire and rope may be used for the belts 9 in the elevation driver 7.

The elevation device 10 in the present preferred embodiment is provided so as to be elevated and lowered by the elevation driver 7, and defines and functions as a platform in the overhead transport vehicle 1. The holder 11 holds the FOUP 90. The holder 11 includes a pair of L-shaped arms 12 and 12, hands 13 and 13 fixed to the arms 12 and 12, and an opening and closing mechanism 15 to open and close the pair of arms 12 and 12.

A pair of arms 12 and 12 is connected to the opening and closing mechanism 15. The opening and closing mechanism 15 moves a pair of arms 12 and 12 in a direction in which they move closer to each other and a direction in which they move apart from each other. The opening and closing mechanism 15 operates to allow a pair of arms 12 and 12 to advance and retract in the front-back direction. A pair of hands 13 and 13 fixed to the arms 12 and 12 are thus opened and closed. In the present preferred embodiment, the level position of the holder 11 (elevation device 10) is adjusted such that the holding surfaces of the hands 13 are below the level of the lower surface of the flange 95 when a pair of hands 13 and 13 is in the open state. Then, in this state, a pair of hands 13 and 13 is closed such that the holding surfaces of the hands 13 and 13 advance to below the lower surface of the flange 95. In this state, the elevation device 10 is elevated such that a pair of hands 13 and 13 holds (grips) the flange 95 to carry the FOUP 90.

Figure 10:
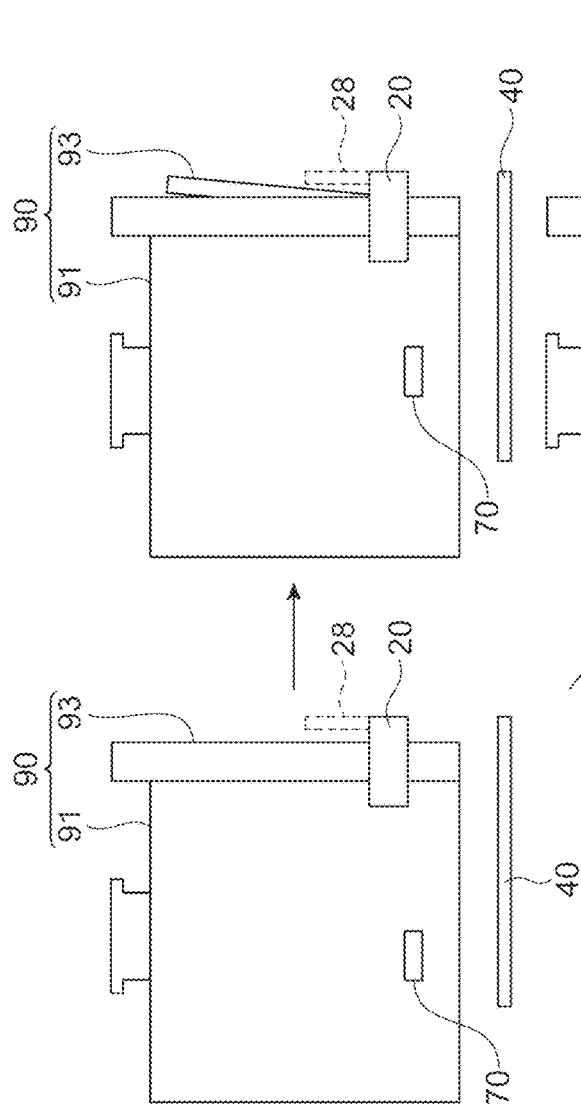
FIGS. 10A to 10C illustrate the function of the first lid drop-preventing member and the second lid drop-preventing member according to a preferred embodiment of the present invention.

As illustrated in FIG. 2 to FIG. 5, the first lid drop-preventing member 20 is disposed on the front surface of the lid 93 to prevent dropping of the lid 93 from the FOUP 90 held by the holder 11 (see FIG. 1). Specifically, as illustrated in FIG. 10(B), the function is fulfilled when the lid falls obliquely to the opening of the case 91. As illustrated in FIG. 2 to FIG. 5, the first lid drop-preventing member 20 includes a pivot shaft in the vertical direction and is pivotable along a front surface 90a and a side surface 90b of the FOUP 90, between an advanced position P1 disposed in front of the lid 93 and a retracted position P2 disposed at a position retracted from the front of the lid 93.

The first lid drop-preventing member 20 is a plate-shaped member extending from the pivot shaft 20a to a front end 20b. The first lid drop-preventing member 20 is preferably made of a material such as stainless steel, for example. The first lid drop-preventing member 20 includes a first linear portion 21, a first bending portion 22, a second linear portion 23, a second bending portion (bending portion) 24, and a third linear portion (linear portion) 25. The first lid drop-preventing member 20 includes a hole 20c extending through the second linear portion 23, the second bending portion 24, and the third linear portion 25. This structure reduces the weight of the first lid drop-preventing member 20 while keeping the distance in the vertical direction. In the present preferred embodiment, the first lid drop-preventing member 20 extends from the pivot shaft 20a to the front end 20b with an arm 58 interposed. However, the first lid drop-preventing member 20 may be a single member extending from the pivot shaft 20a to the front end 20b.

The first linear portion 21 is fixed to the arm 58 of the pivot mechanism 50 described in detail later. The first bending portion 22 is a connector between the first linear portion 21 and the second linear portion 23 and is bent by presswork. The second linear portion 23 is supported by a guide 30 described in detail later. The second bending portion 24 is a connector between the second linear portion 23 and the third linear portion 25 and is bent by presswork. The third linear portion 25 includes the front end 20b of the first lid drop-preventing member 20.

The third linear portion 25 is parallel or substantially parallel with the lid 93 when the first lid drop-preventing member 20 is positioned at the advanced position P1. When the first lid drop-preventing member 20 is at the advanced position P1, letting the distance between an end portion 90c of the FOUP 90 in the traveling direction and the first lid drop-preventing member 20 be a first distance D1 and the distance between a center portion 90d closer to the center than the end portion 90c of the FOUP 90 and the first lid drop-preventing member 20 be a second distance D2, the first distance D1 is preferably equal to the second distance D2 or longer than the second distance D2. In the present preferred embodiment, the first distance D1 and the second distance D2 are preferably equal or substantially equal to each other.

Figure 6:
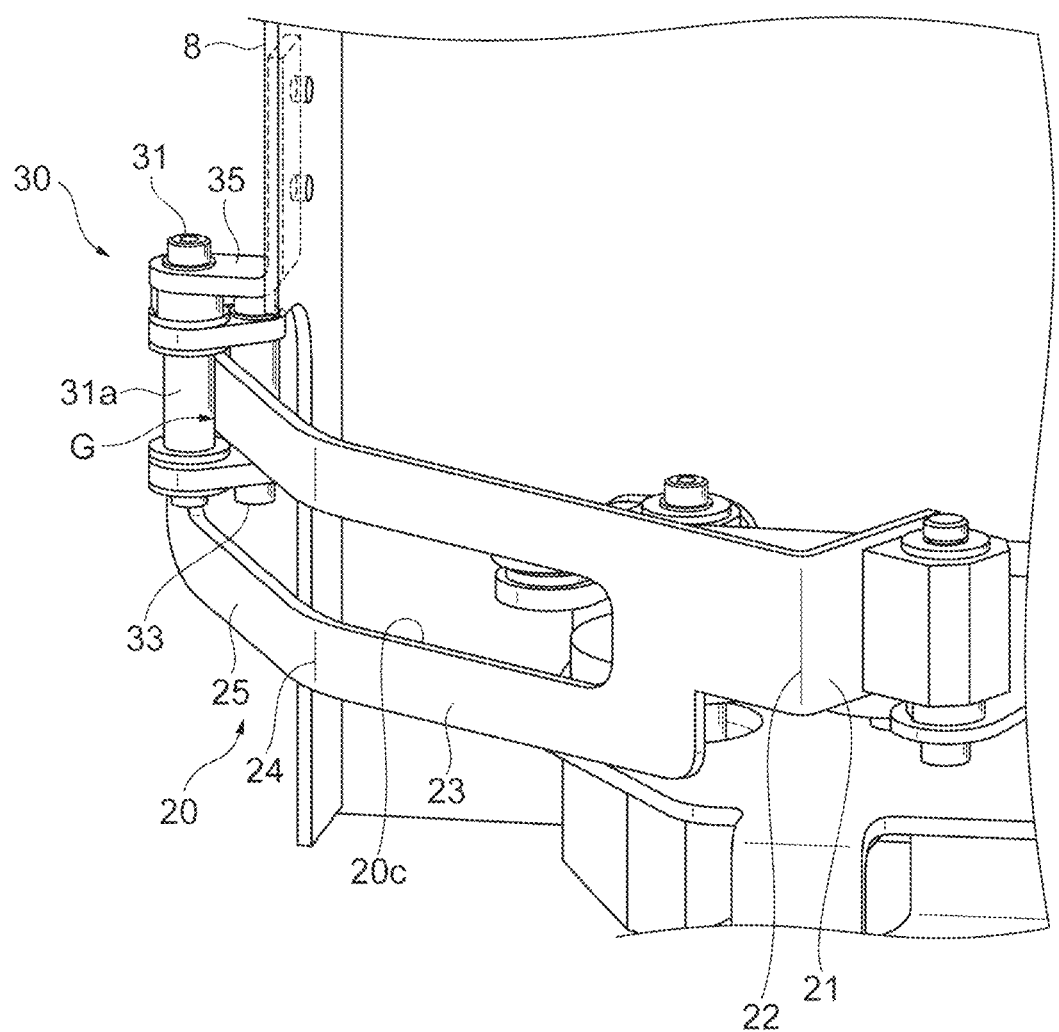
FIG. 6 is an enlarged perspective view of the vicinity of a guide.

A pair of frames 8 and 8 are each provided with the guide 30. As illustrated in FIG. 6, the guide 30 includes a first support portion 31 with a cylindrical shape extending in the vertical direction and a second support portion 33 with a cylindrical shape extending in the vertical direction. The second support portion 33 is pivotable along an outer circumferential surface 31a of the first support portion 31 with a certain gap G kept from the outer circumferential surface 31a of the first support portion 31. The first lid drop-preventing member 20 is able to pass through the gap G and is movable in the gap G. The guide 30 is fixed to the frame 8 with a bracket 35.

As illustrated in FIG. 2 to FIG. 5, each of a pair of frames 8 and 8 stores therein the pivot mechanism 50 for the first lid drop-preventing member 20. When the position of the lid 93 in the width direction is a reference position BL, the position of the pivot shaft 20a of the first lid drop-preventing member 20 is offset by a distance D3 behind the reference position BL with the lid 93 viewed from the front.

The pivot mechanism 50 includes a driver 51, a drive shaft 52, a first gear 53, a second gear 54, a first link 55, a second link 56, a third gear 57, and an arm 58. The pivot mechanism converts pivot motion by the driver 51 into linear motion (reciprocating motion between the advanced position and the retracted position) of the first lid drop-preventing member 20. The operation of the pivot mechanism 50 is described below with reference to FIGS. 7A to 7C.

Figure 7A:
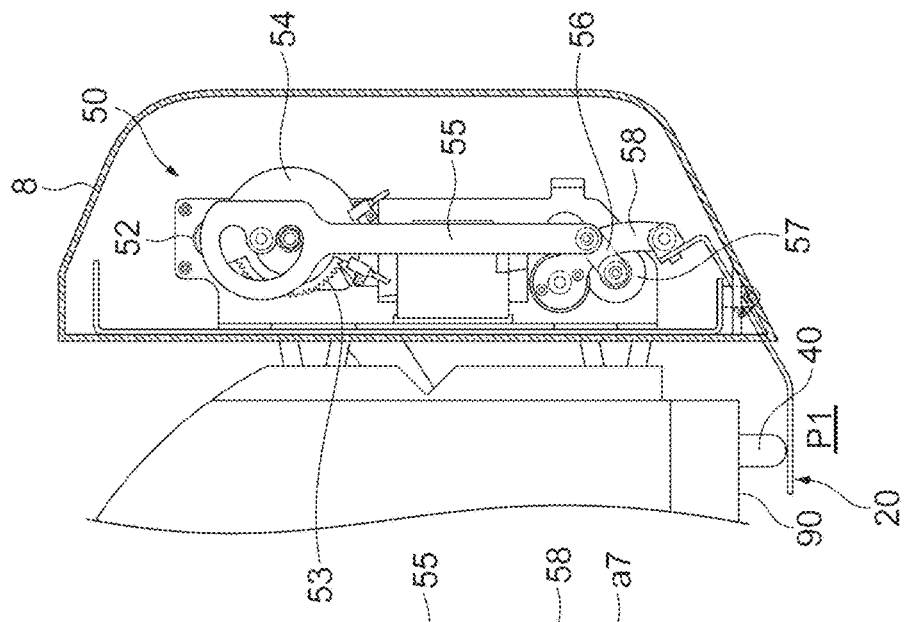
FIGS. 7A to 7C are diagrams illustrating transition of the first lid drop-preventing member in FIG. 1 moving from the retracted position to the advanced position.
Figure 7B:
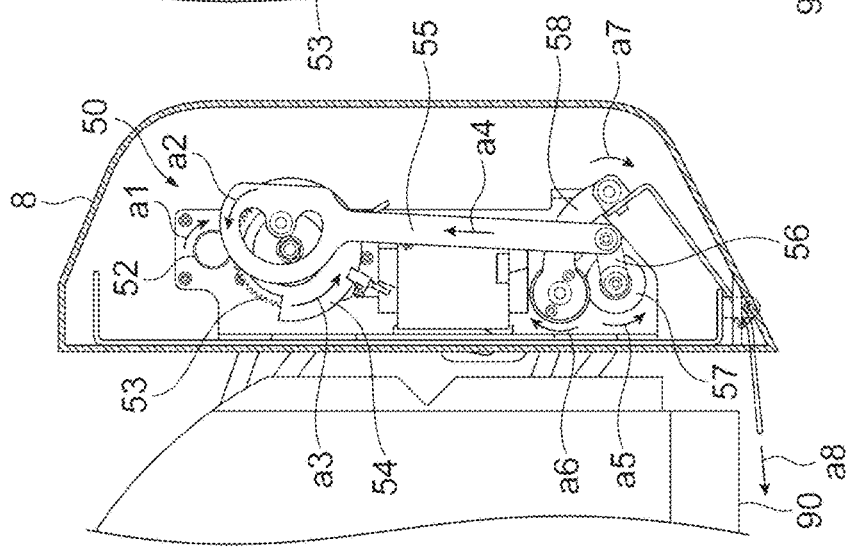
Figure 7C:
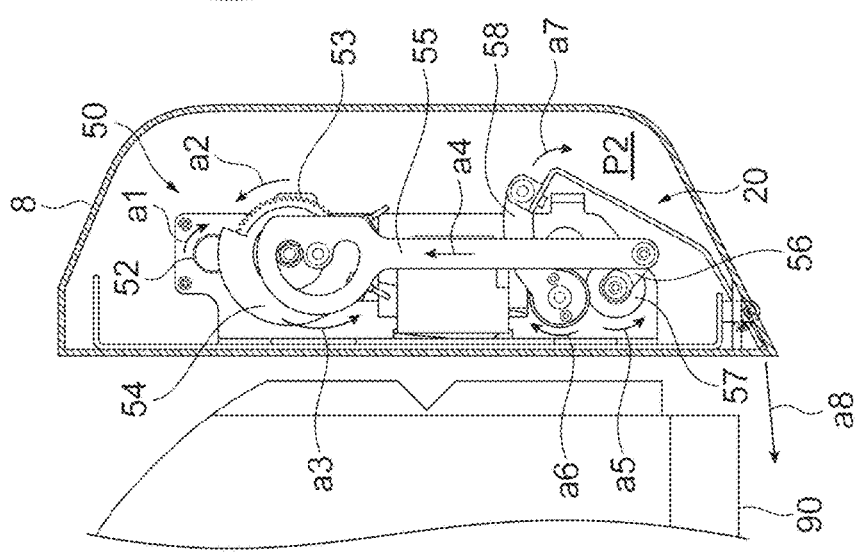

As illustrated in FIGS. 7A to 7C, the drive shaft 52 pivoted by the driver 51 includes a gear. The first gear 53 is able to be engaged with the gear of the drive shaft 52 so that when the drive shaft 52 rotates in the arrow direction a1, the first gear 53 also rotates in the arrow direction a2. The second gear 54 is fixed to the first gear 53 so that when the first gear 53 rotates in the arrow direction a2, the second gear 54 also rotates in the arrow direction a3. The first link 55 is connected to a position shifted from the pivot axis of the second gear 54. The rotational motion of the second gear 54 in the arrow direction a3 produces a linear motion in the arrow direction a4 to the first link 55.

The first link 55 and the second link 56 are connected to each other in a pivotable manner, and the second link 56 is fixed to the third gear 57. The movement of the second link 56 when the first link 55 moves in the arrow direction a4 causes the third gear 57 to rotate in the arrow direction a5. The third gear 57 and the arm 58 include respective gears engaged with each other. When the third gear 57 rotates in the arrow direction a5, the arm 58 rotates in the arrow direction a6. When the arm 58 rotates in the arrow direction a6, the end portion of the arm 58 having the first lid drop-preventing member 20 fixed thereto rotates in the arrow direction a7. The first lid drop-preventing member 20 is thus pushed from the side surface of the FOUP 90 (the inside of the frame 8) to the front surface of the FOUP 90 (arrow direction a8). That is, the first lid drop-preventing member 20 advances from the retracted position P2 to the advanced position P1. The first lid drop-preventing member 20 is moved from the advanced position P1 to the retracted position P2 through the operation in the opposite direction to the operation described above.

Figure 2:
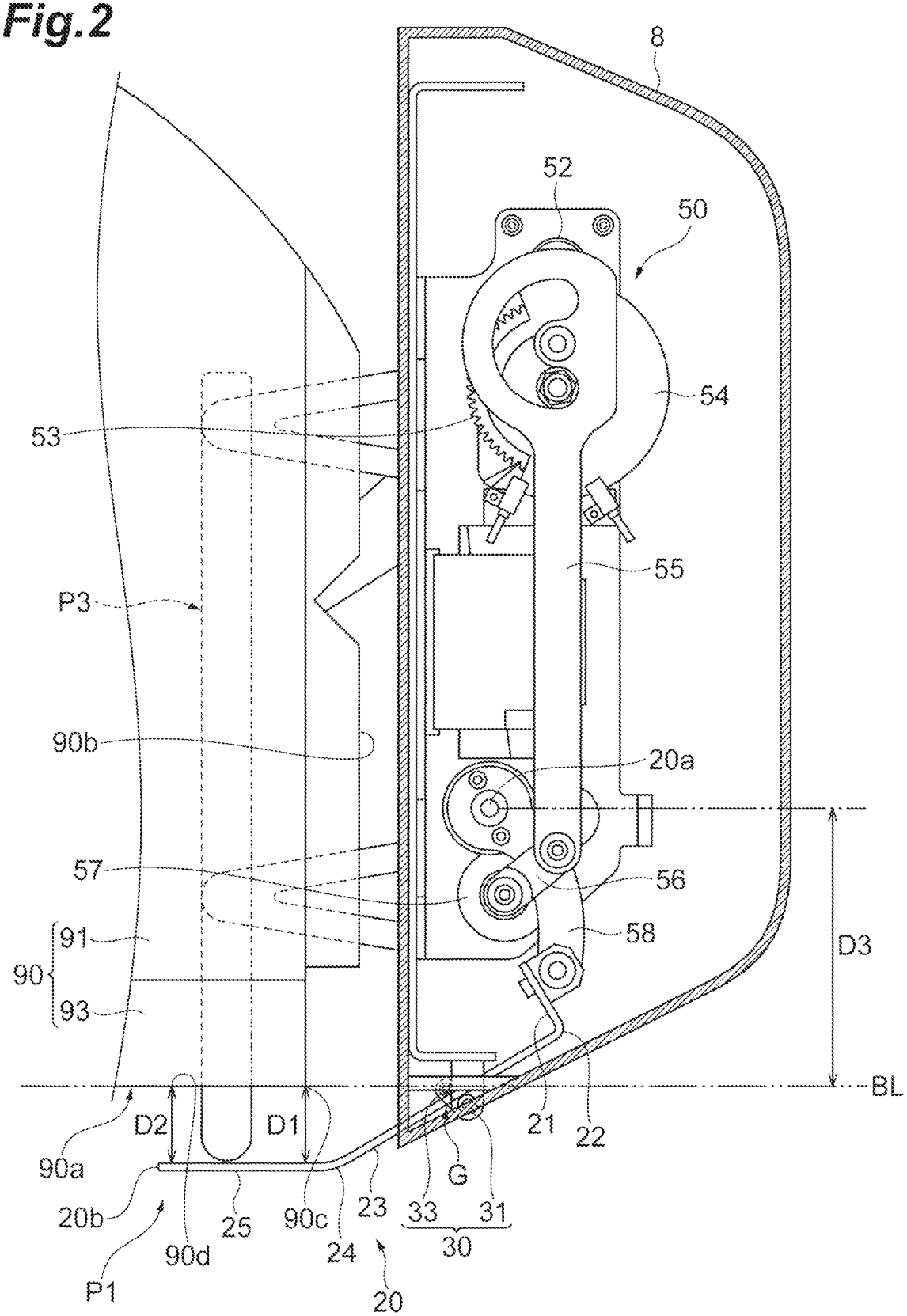
FIG. 2 is a cross-sectional view taken along line II-II when a first lid drop-preventing member in FIG. 1 is positioned at an advanced position.
Figure 8:
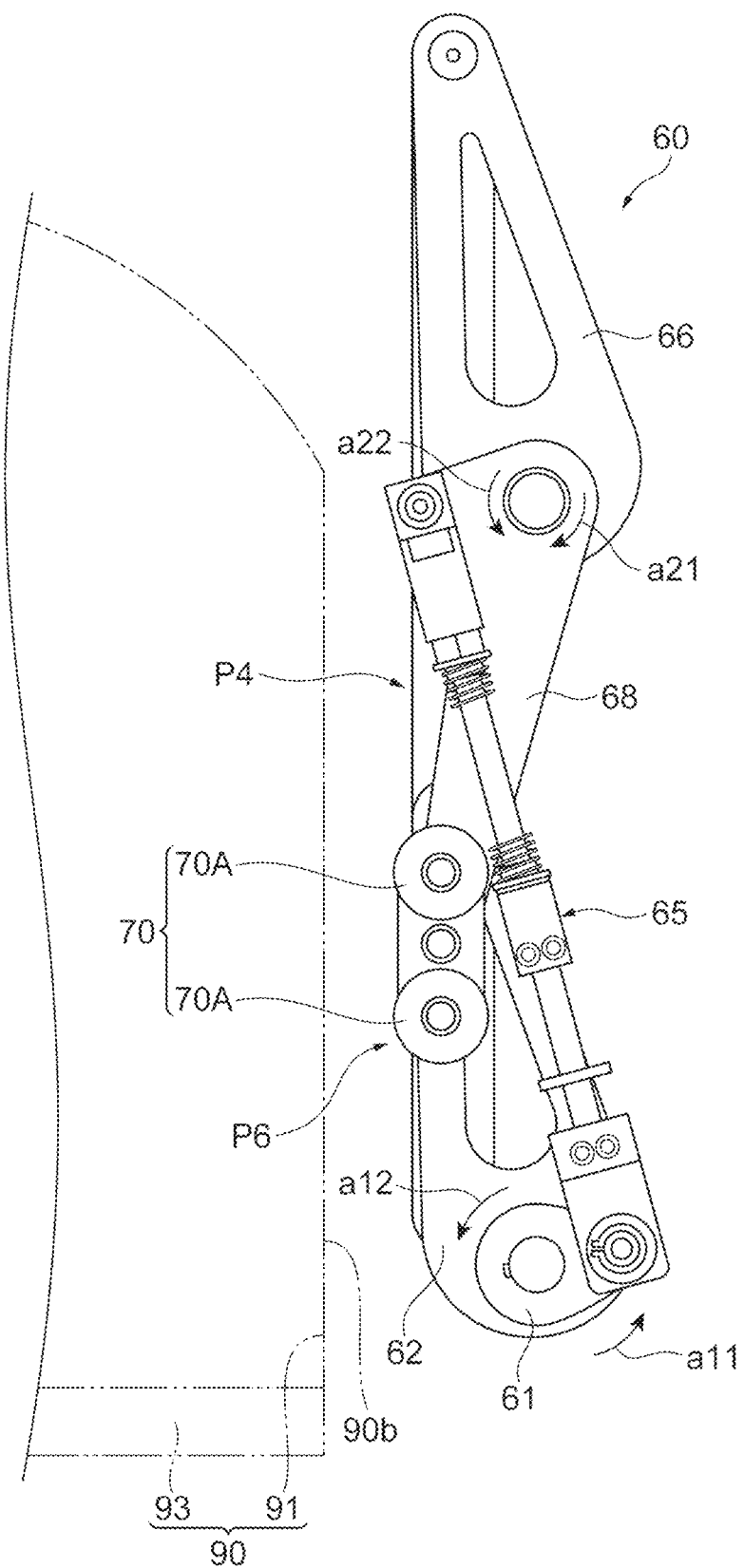
FIG. 8 is a plan view of a second lid drop-preventing member and a swing-preventing member in FIG. 1 positioned at the retracted position.
Figure 9:
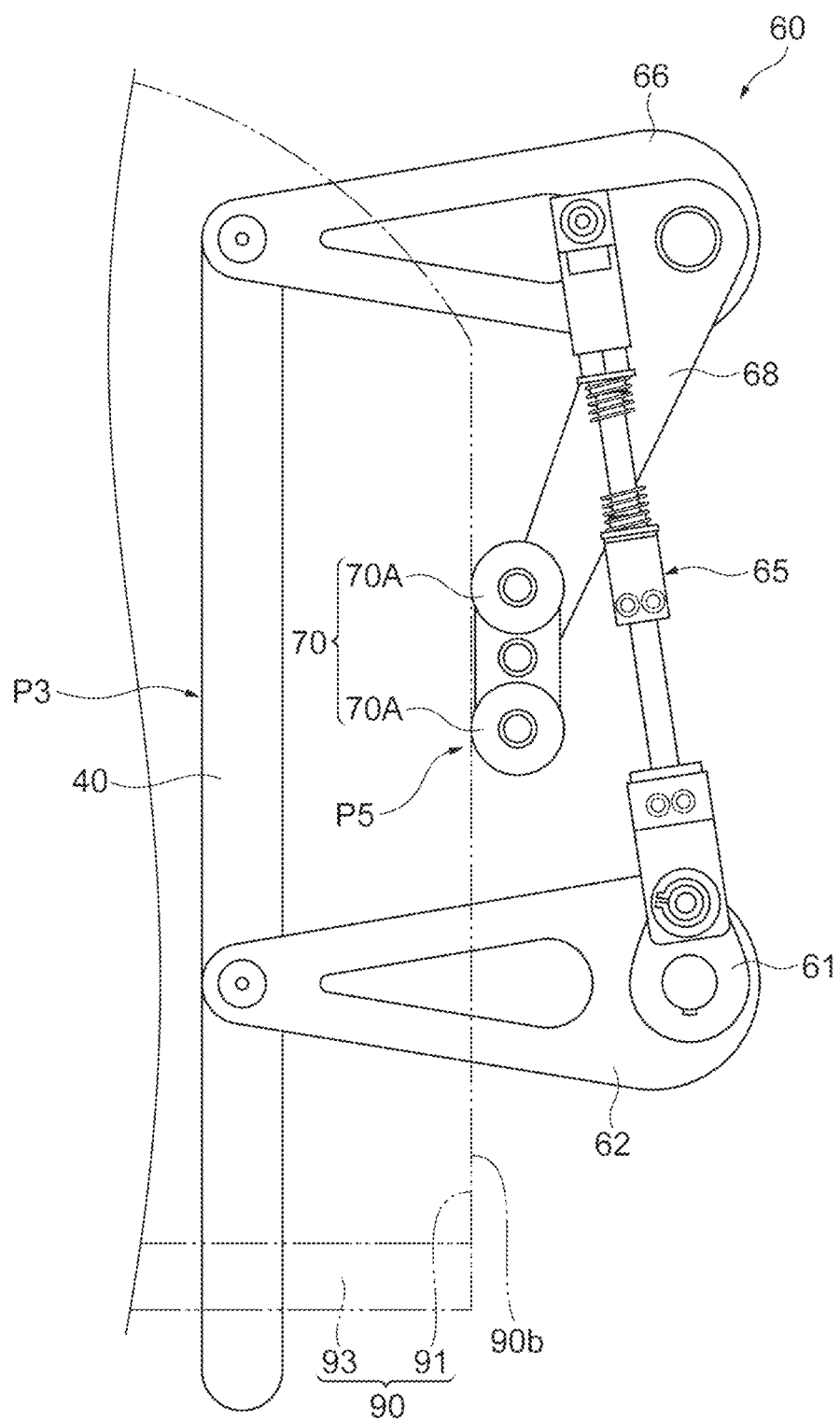
FIG. 9 is a plan view of the second lid drop-preventing member and the swing-preventing member in FIG. 1 positioned at the advanced position.

As illustrated in FIG. 2, the second lid drop-preventing member 40 is disposed on the lower surface of the FOUP 90 to prevent dropping of the FOUP 90 itself held by the holder 11 (see FIG. 1) and the lid 93 from the FOUP 90. Specifically, as illustrated in FIG. 10(C), the function is fulfilled when the lid 93 is detached in parallel with the opening of the casing 91. The second lid drop-preventing member 40 is a plate-shaped member extending in the width direction and is preferably made of a material such as stainless steel, for example. The second lid drop-preventing member 40 is movable between an advanced position P3 disposed below the lid 93 as illustrated in FIG. 2 and FIG. 9 and a position retracted from below the lid 93, that is, a retracted position P4 disposed at a position stored in the region of the frame 8 when viewed vertically from above as illustrated in FIG. 8.

Figure 3:
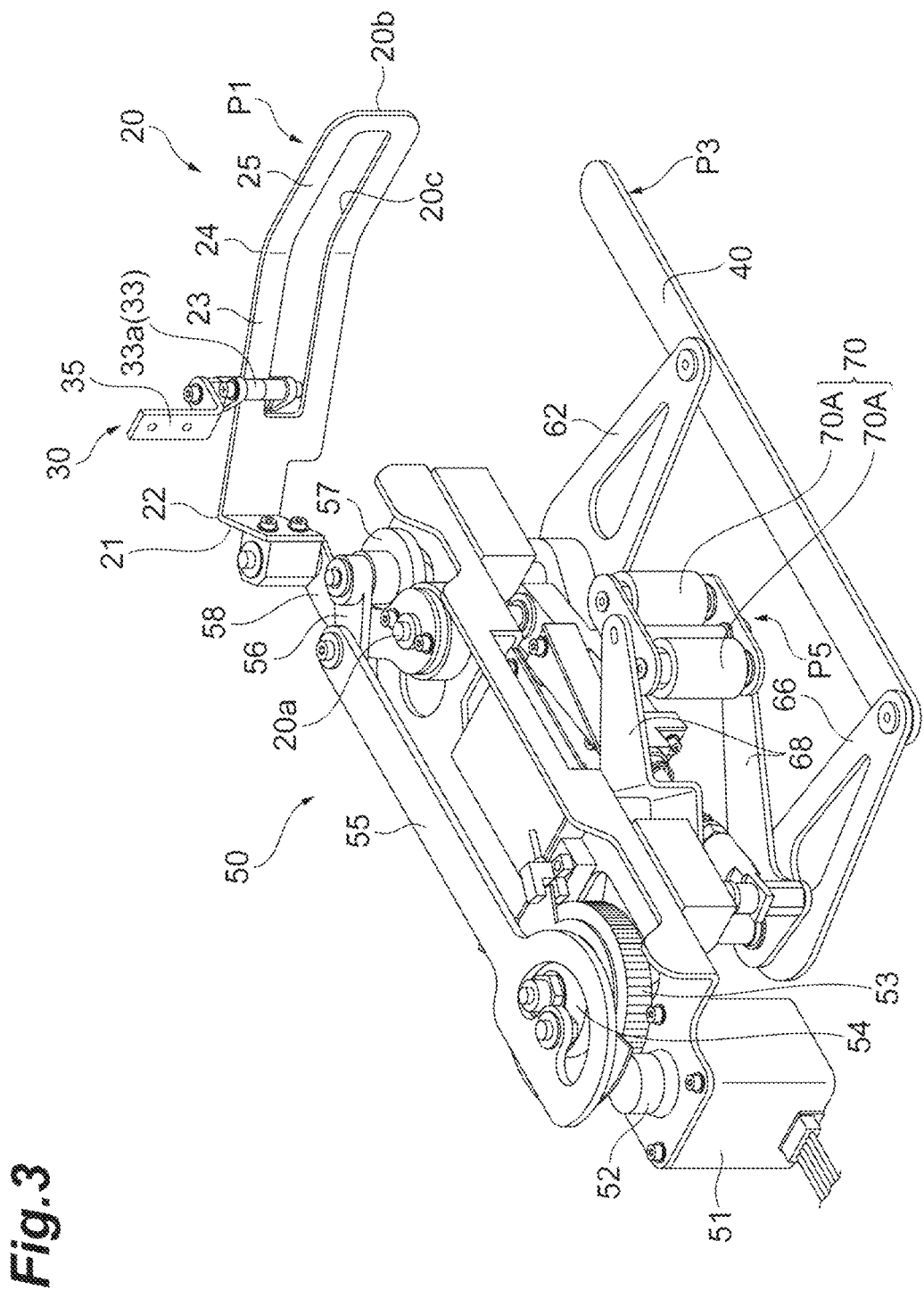
FIG. 3 is a perspective view of each mechanism disposed inside a frame when the first lid drop-preventing member in FIG. 1 is positioned at the advanced position.
Figure 5:
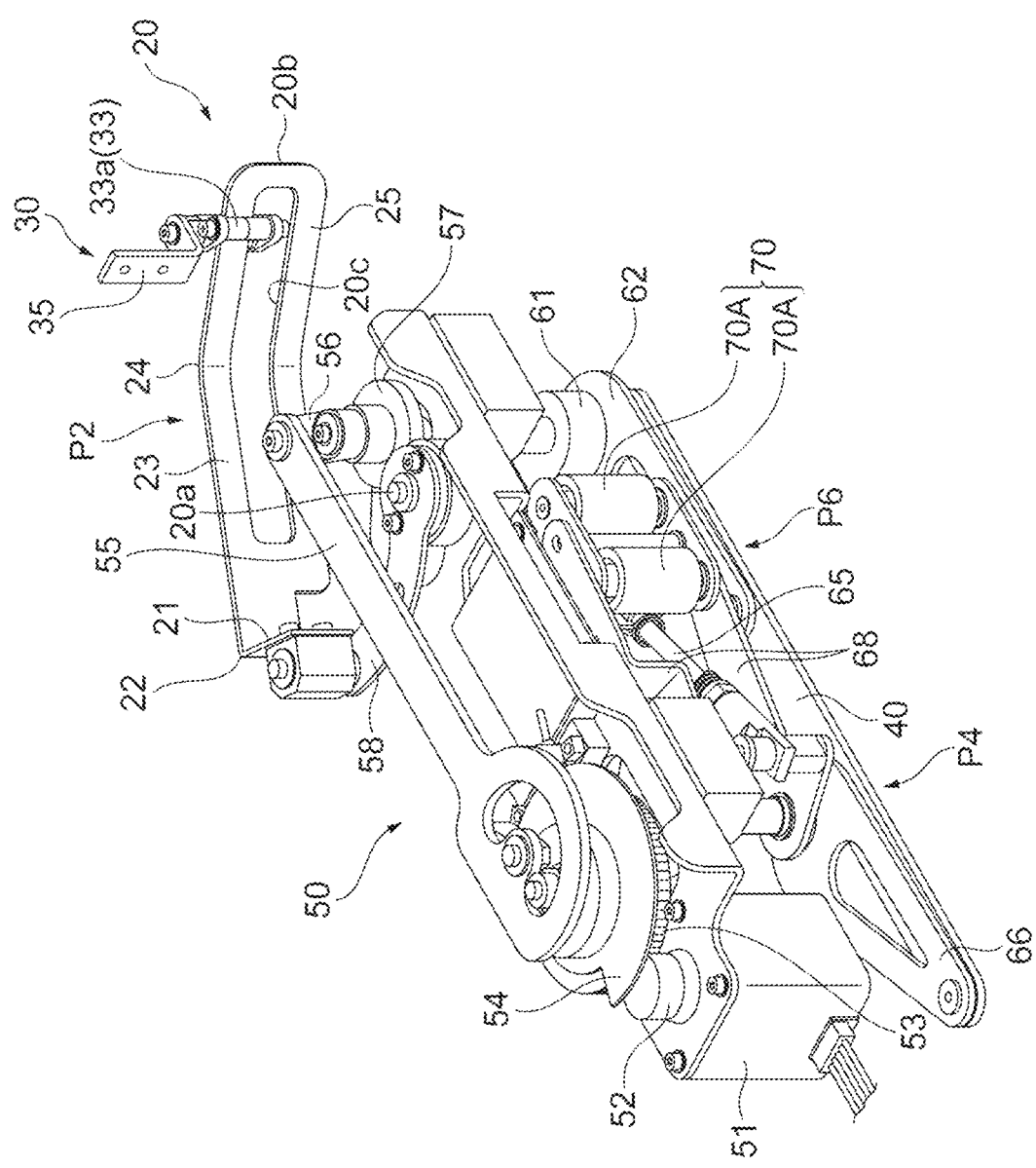
FIG. 5 is a perspective view of each mechanism disposed inside the frame when the first lid drop-preventing member in FIG. 1 is positioned at the retracted position.

As illustrated in FIG. 3 and FIG. 5, the movement of the second lid drop-preventing member 40 to the advanced position P3 and the retracted position P4 is interlocked with the movement of the first lid drop-preventing member 20 to the advanced position P1 and the retracted position P2. That is, when the first lid drop-preventing member 20 advances to the advanced position P1, the second lid drop-preventing member 40 also advances to the advanced position P3. When the first lid drop-preventing member 20 retracts to the retracted position P2, the second lid drop-preventing member 40 also retracts to the retracted position P4.

The swing-preventing member 70 illustrated in FIG. 1 supports the side surface 90b of the FOUP 90 in contact therewith to suppress swinging in the front-back direction (travel direction) and the left-right direction of the FOUP 90 held by the holder 11 in the overhead transport vehicle 1 during travel. As illustrated in FIG. 3 and FIG. 5, the swing-preventing member 70 includes two rollers 70A and 70A that support the FOUP 90 (see FIG. 1) in contact therewith. The swing-preventing member 70 is provided so as to be movable between an advanced position P5 disposed in contact with the side surface 90b of the FOUP 90 as illustrated in FIG. 3 and FIG. 9 and a retracted position P6 disposed at a position away from the side surface 90b of the FOUP 90 as illustrated in FIG. 5 and FIG. 8.

As illustrated in FIG. 3 and FIG. 5, the movement of the swing-preventing member 70 to the advanced position P5 and the retracted position P6 is interlocked with the movement of the first lid drop-preventing member 20 to the advanced position P1 and the retracted position P2. That is, when the first lid drop-preventing member 20 advances to the advanced position P1, the swing-preventing member 70 also advances to the advanced position P5. When the first lid drop-preventing member 20 retracts to the retracted position P2, the swing-preventing member 70 also retracts to the retracted position P6. The interlocked motion of the second lid drop-preventing member 40 and the swing-preventing member 70 with the first lid drop-preventing member 20 is described below.

As illustrated in FIG. 8 and FIG. 9, the movement mechanism 60 for the second lid drop-preventing member 40 and the swing-preventing member 70 is stored in each of a pair of frames 8 and 8 (see FIG. 2 and FIG. 4) and includes a cam 61, a third link 62, an elastic member 65, a fourth link 66, and a fifth link 68.

Figure 4:
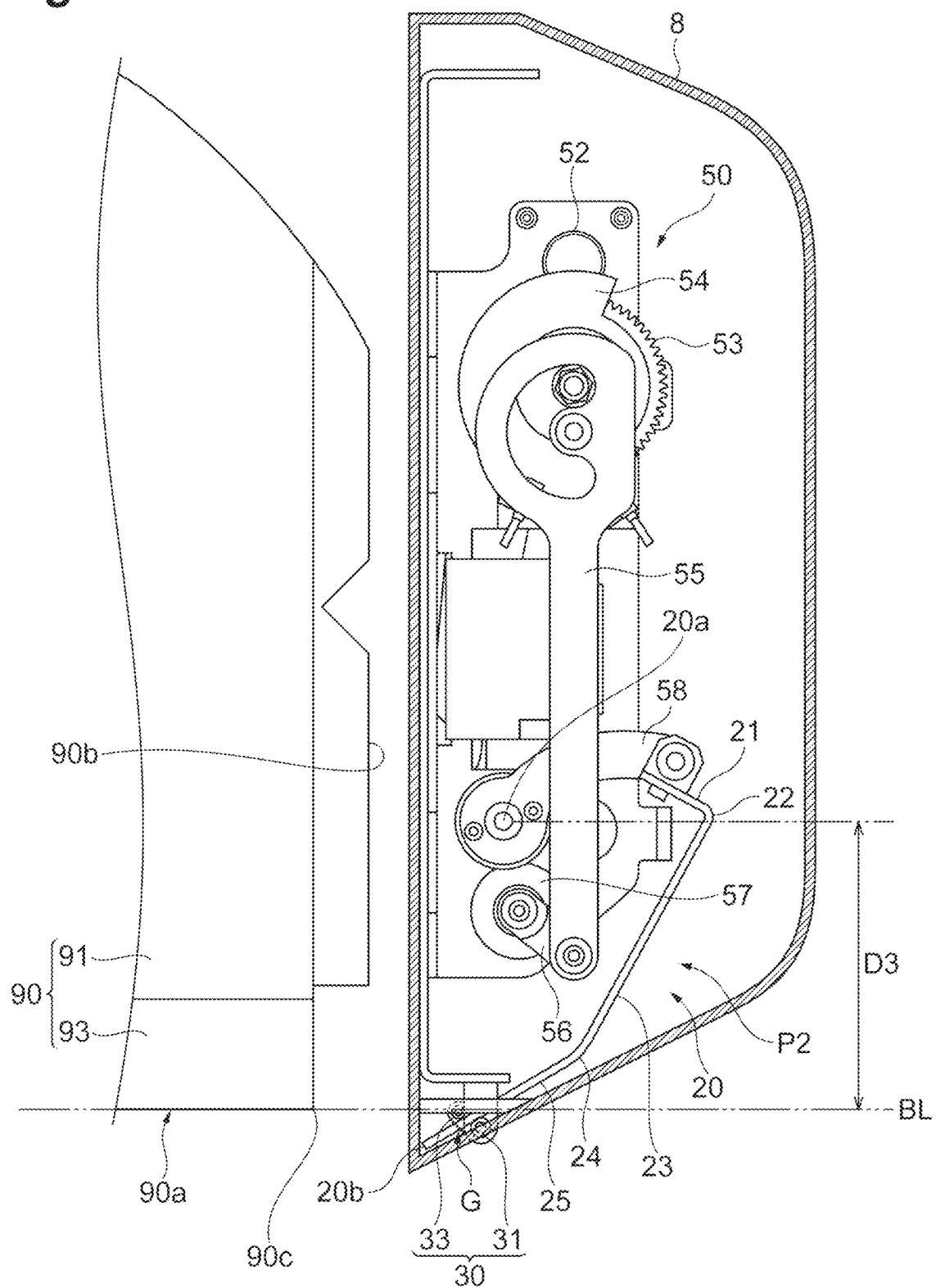
FIG. 4 is a cross-sectional view taken along line II-II when the first lid drop-preventing member in FIG. 1 is positioned at a retracted position.

The cam 61 is connected to the third gear 57 so as to pivot integrally with the third gear 57 that pivots in the advancing operation of the first lid drop-preventing member 20 (see FIG. 2 and FIG. 4). When the third gear 57 rotates, the cam 61 interlocked with this rotation rotates in the arrow direction a11. The cam 61 is fixed to the third link 62 and connected to the fifth link 68 with an elastic member 65 interposed. The fifth link 68 is pivotably connected to the fourth link 66. When the cam 61 rotates, the third link 62 rotates in the arrow direction a12 starting from the pivot point with the cam 61. Simultaneously, the fifth link 68 rotates in the arrow direction a21 starting from the pivot point with the fourth link 66. Simultaneously, the fourth link 66 rotates in the arrow direction a22 starting from the pivot point with the fifth link 68.

Through the operation described above, the second lid drop-preventing member 40 pivotably connected with the third link 62 and the fourth link 66 advances from the retracted position P4 to the advanced position P3, and the swing-preventing member 70 pivotably connected with the fifth link 68 advances from the retracted position P6 to the advanced position P5. The second lid drop-preventing member 40 and the swing-preventing member 70 are moved from the advanced position P5 to the retracted position P6 through the operation in the opposite direction to the operation described above.

The operation effect of the overhead transport vehicle 1 in the foregoing preferred embodiment is described. In the overhead transport vehicle 1 in the present preferred embodiment, as illustrated in FIG. 2, since the first lid drop-preventing member 20 is able to advance to the advanced position P1 disposed in front of the lid 93, the lid 93 is able to be held in position even if the lid 93 is detached from the FOUP 90. This configuration prevents the lid 93 from dropping from the FOUP 90.

In the overhead transport vehicle 1 in the foregoing preferred embodiment, as illustrated in FIG. 2 and FIG. 4, since the position of the pivot shaft 20a is offset (distance D3) behind the reference position BL with the lid 93 viewed from the front, the pivot mechanism 50 for the first lid drop-preventing member 20 is able to be brought closer to the center in the width direction of the frame 8. With this configuration, although the pivot mechanism 50 for the first lid drop-preventing member 20 that prevents dropping of the lid 93 from the FOUP 90 is provided in each of the frames 8 and 8 at the front and the back in the traveling direction, an increase in size in the width direction of the frames 8 is reduced or prevented.

In the overhead transport vehicle 1 in the foregoing preferred embodiment, as illustrated in FIG. 2, the third linear portion 25 is between the second bending portion 24 and the front end 20b of the first lid drop-preventing member 20. When the first lid drop-preventing member 20 is positioned at the advanced position P1, the first lid drop-preventing member 20 is able to be set in parallel or substantially in parallel with the lid 93. The distance (D1, D2) between the first lid drop-preventing member 20 and the FOUP 90 thus is able to be easily adjusted. As described above, since the distance (D1, D2) between the first lid drop-preventing member 20 and the FOUP 90 is easily adjusted, the distance D1 from the first lid drop-preventing member 20 is kept in particular at the end portion 90c of the FOUP 90 where the first lid drop-preventing member 20 tends to collide with the FOUP 90. As a result, the possibility of collision of the first lid drop-preventing member 20 with the FOUP 90 is able to be reduced.

In the overhead transport vehicle 1 in the foregoing preferred embodiment, the third linear portion 25 of the first lid drop-preventing member 20 is provided in parallel with the lid 93 when the first lid drop-preventing member 20 is positioned at the advanced position P1 as illustrated in FIG. 2. That is, when the first lid drop-preventing member 20 is positioned at the advanced position P1, the distance (the first distance) D1 between the end portion 90c of the FOUP 90 in the travel direction and the first lid drop-preventing member 20 is equal to the distance (the second distance) D2 between the center portion 90*d* closer to the center than the end portion 90*c* of the FOUP 90 and the first lid drop-preventing member 20. In the overhead transport vehicle 1 with this configuration, the distances D1 and D2 between the first lid drop-preventing member 20 and the FOUP 90 are easily adjusted.

In the overhead transport vehicle 1 in the foregoing preferred embodiment, as illustrated in FIG. 6, since each of the frames 8 and 8 is provided with the guide 30 that supports the first lid drop-preventing member 20, the first lid drop-preventing member 20 is able to be smoothly moved to the advanced position P1 (see FIG. 2) and the retracted position P2 (see FIG. 4). The first lid drop-preventing member 20 is able to be securely fixed to each of the frames 8 and 8 to reduce or prevent vibration during traveling of the overhead transport vehicle 1.

In the overhead transport vehicle 1 in the foregoing preferred embodiment, as illustrated in FIG. 3 and FIG. 5, the movement of the second lid drop-preventing member 40 to the advanced position P3 and the retracted position P4 is interlocked with the movement of the first lid drop-preventing member 20 to the advanced position P1 and the retracted position P2. The movement of the swing-preventing member 70 to the advanced position P5 and the retracted position P6 is interlocked with the movement of the first lid drop-preventing member 20 to the advanced position P1 and the retracted position P2. In the foregoing preferred embodiment, since the members having different functions is able to be simultaneously moved, dropping of the lid 93 is able to be effectively prevented.

Although preferred embodiments have been described above, the present invention is not limited to the foregoing preferred embodiments and various modifications are possible without departing from the spirit of the present invention.

Figure 11:
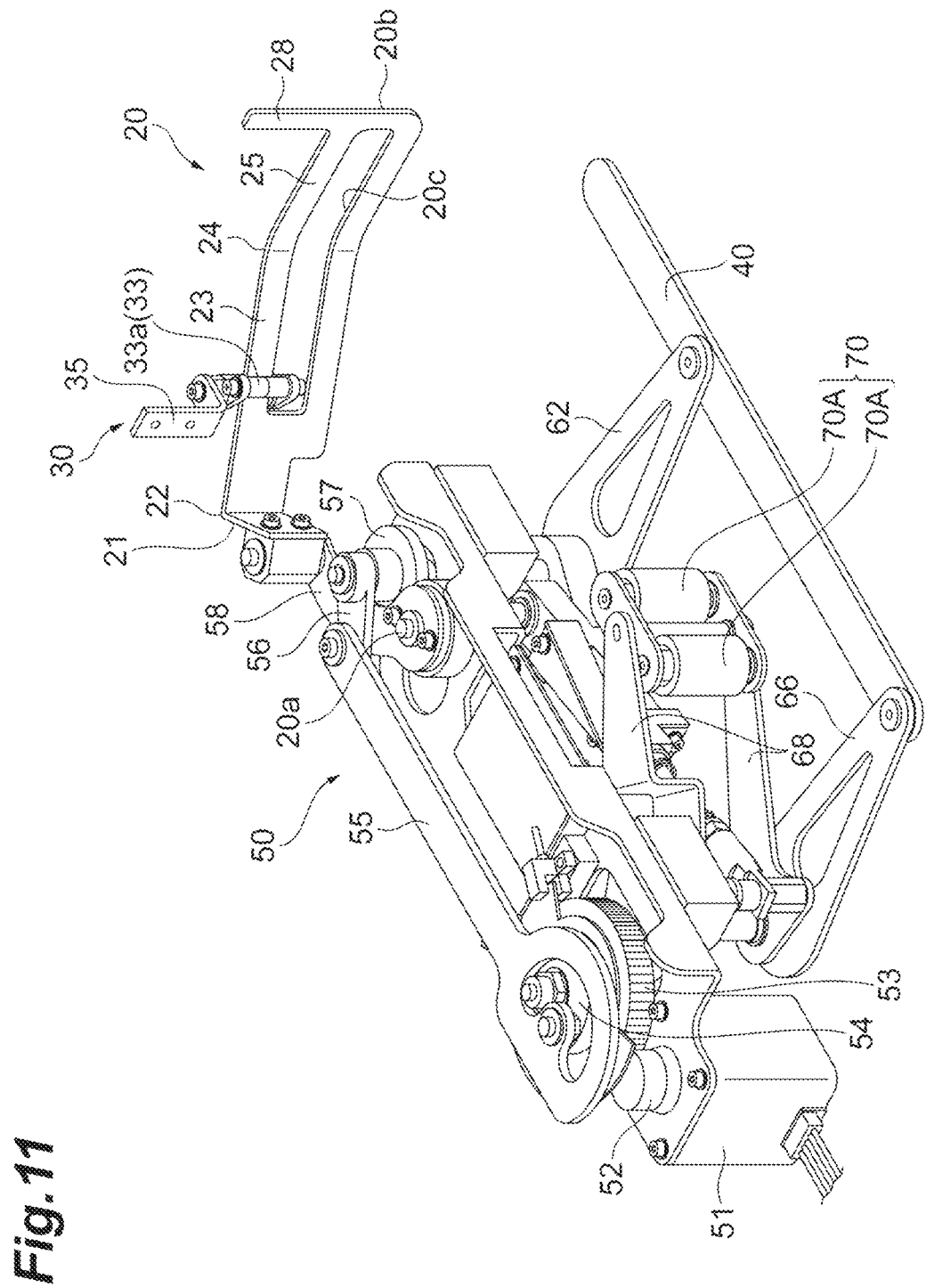
FIG. 11 is a perspective view of each mechanism disposed inside the frame when the first lid drop-preventing member according to a modification is positioned at the advanced position.

In the overhead transport vehicle 1 in the foregoing preferred embodiment, the first lid drop-preventing member 20 that is a plate-shaped member extending from the pivot shaft 20*a* to the front end 20*b* in one direction has been described. However, for example, as illustrated in FIG. 11, the front end 20*b* may include a fourth linear portion 28 extending in the vertical direction. In this configuration, when the lid 93 is detached from the FOUP 90, the lid 93 is able to be held not only in the front-back direction but also in the vertical direction. As a result, the first lid drop-preventing member 20 is able to support the lid 93 more stably. This configuration is able to eliminate the configuration that supports the upper surface of the lid 93 which is conventionally provided, for example, at the hands 13 and 13 of the holder 11.

In the foregoing preferred embodiments and modifications, the first lid drop-preventing member 20, the second lid drop-preventing member 40, and the swing-preventing member 70 are interlocked with each other. However, they may operate individually or any two elements may be interlocked with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An overhead transport vehicle capable of traveling along a track and convey a container in a suspended state, the container including a removable lid, the overhead transport vehicle comprising:
   a gripper to grip the container with the lid oriented in a width direction crossing a traveling direction;
   a pair of frames at front and back in the traveling direction relative to the gripper; and
   a first lid drop-preventing member pivotable along a horizontal plane about a pivot shaft in a vertical direction, between an advanced position in front of the lid and a retracted position at a position retracted from the front of the lid; wherein
   the first lid drop-preventing member includes a plate-shaped member extending from the pivot shaft to a front end and including a bending portion and a linear portion between the bending portion and the front end.

2. The overhead transport vehicle according to claim 1, wherein
   each of the pair of frames stores therein a pivot mechanism for the first lid drop-preventing member; and
   when a position of the lid in the width direction is a reference position, a position of the pivot shaft is offset behind the reference position with the lid viewed from the front.

3. The overhead transport vehicle according to claim 1, wherein the linear portion is parallel or substantially in parallel with the lid when the first lid drop-preventing member is positioned at the advanced position.

4. The overhead transport vehicle according to claim 1, wherein
   when the first lid drop-preventing member is positioned at the advanced position, letting a distance between an end portion of the container in the traveling direction and the first lid drop-preventing member be a first distance and the distance between a center portion closer to a center than the end portion of the container and the first lid drop-preventing member be a second distance; and
   the first distance is equal or substantially equal to the second distance or longer than the second distance.

5. The overhead transport vehicle according to claim 1, further comprising a guide at each of the pair of frames, the guide including a first support portion with a cylindrical shape extending in the vertical direction and a second support portion pivotable along an outer circumferential surface of the first support portion to maintain a gap from the outer circumferential surface of the first support portion; wherein
   the first lid drop-preventing member is movable in the gap.

6. The overhead transport vehicle according to claim 1, further comprising a second lid drop-preventing member movable between an advanced position below the lid and a retracted position at a position retracted from below the lid; wherein
   movement of the second lid drop-preventing member to the advanced position and the retracted position is interlocked with movement of the first lid drop-preventing member to the advanced position and the retracted position.

7. The overhead transport vehicle according to claim 1, further comprising a swing-preventing member movable between an advanced position in contact with a side surface of the container and a retracted position at a position spaced away from the side surface of the container; wherein movement of the swing-preventing member to the advanced position and the retracted position is interlocked with movement of the first lid drop-preventing member to the advanced position and the retracted position.

8. The overhead transport vehicle according to claim 2, wherein the linear portion is parallel or substantially in parallel with the lid when the first lid drop-preventing member is positioned at the advanced position.

9. The overhead transport vehicle according to claim 2, wherein when the first lid drop-preventing member is positioned at the advanced position, letting a distance between an end portion of the container in the traveling direction and the first lid drop-preventing member be a first distance and the distance between a center portion closer to a center than the end portion of the container and the first lid drop-preventing member be a second distance; and the first distance is equal to the second distance or longer than the second distance.

10. The overhead transport vehicle according to claim 2, further comprising a guide at each of the pair of frames, the guide including a first support portion with a cylindrical shape extending in the vertical direction and a second support portion pivotable along an outer circumferential surface of the first support portion to maintain a gap from the outer circumferential surface of the first support portion; wherein the first lid drop-preventing member is movable in the gap.

11. The overhead transport vehicle according to claim 2, further comprising a second lid drop-preventing member movable between an advanced position below the lid and a retracted position at a position retracted from below the lid; wherein movement of the second lid drop-preventing member to the advanced position and the retracted position is interlocked with movement of the first lid drop-preventing member to the advanced position and the retracted position.

12. The overhead transport vehicle according to claim 2, further comprising a swing-preventing member movable between an advanced position in contact with a side surface of the container and a retracted position at a position spaced away from the side surface of the container; wherein movement of the swing-preventing member to the advanced position and the retracted position is interlocked with movement of the first lid drop-preventing member to the advanced position and the retracted position.

13. An overhead transport vehicle capable of traveling along a track and convey a container in a suspended state, the container including a removable lid, the overhead transport vehicle comprising:

a gripper to grip the container with the lid oriented in a width direction crossing a traveling direction;

a pair of frames at front and back in the traveling direction relative to the gripper; and a first lid drop-preventing member pivotable along a horizontal plane about a pivot shaft in a vertical direction, between an advanced position in front of the lid and a retracted position at a position retracted from the front of the lid; wherein each of the pair of frames stores therein a pivot mechanism for the first lid drop-preventing member; and when a position of the lid in the width direction is a reference position, a position of the pivot shaft is offset behind the reference position with the lid viewed from the front.

14. An overhead transport vehicle capable of traveling along a track and convey a container in a suspended state, the container including a removable lid, the overhead transport vehicle comprising:

a gripper to grip the container with the lid oriented in a width direction crossing a traveling direction;

a pair of frames at front and back in the traveling direction relative to the gripper; and a first lid drop-preventing member pivotable along a horizontal plane about a pivot shaft in a vertical direction, between an advanced position in front of the lid and a retracted position at a position retracted from the front of the lid; wherein when the first lid drop-preventing member is positioned at the advanced position, letting a distance between an end portion of the container in the traveling direction and the first lid drop-preventing member be a first distance and the distance between a center portion closer to a center than the end portion of the container and the first lid drop-preventing member be a second distance; and the first distance is equal or substantially equal to the second distance or longer than the second distance.

* * * * *